(12) United States Patent
Gravrand et al.

(10) Patent No.: US 9,048,357 B2
(45) Date of Patent: Jun. 2, 2015

(54) SEMICONDUCTOR STRUCTURE, DEVICE COMPRISING SUCH A STRUCTURE, AND METHOD FOR PRODUCING A SEMICONDUCTOR STRUCTURE

(71) Applicant: Commissariat a l'energie atomique et aux ene alt, Paris (FR)

(72) Inventors: Olivier Gravrand, Fontanil Cornillon (FR); Alexandre Ferron, Brie et Angonnes (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/370,581

(22) PCT Filed: Jan. 2, 2013

(86) PCT No.: PCT/EP2013/050020
§ 371 (c)(1),
(2) Date: Jul. 3, 2014

(87) PCT Pub. No.: WO2013/102631
PCT Pub. Date: Jul. 11, 2013

(65) Prior Publication Data
US 2015/0008551 A1 Jan. 8, 2015

(30) Foreign Application Priority Data

Jan. 4, 2012 (FR) .................................. 12 50086

(51) Int. Cl.
*H01L 31/18* (2006.01)
*H01L 31/0352* (2006.01)
(Continued)

(52) U.S. Cl.
CPC .... *H01L 31/035272* (2013.01); *H01L 31/1832* (2013.01); *Y02E 10/50* (2013.01); *H01L 31/02966* (2013.01); *H01L 31/101* (2013.01); *H01L 31/18* (2013.01)

(58) Field of Classification Search
CPC .............................. H01L 31/18; H01L 31/101
See application file for complete search history.

(56) References Cited

U.S. PATENT DOCUMENTS

2007/0075224 A1* 4/2007 Jones et al. .................... 250/226
2009/0256231 A1 10/2009 Klipstein
(Continued)

OTHER PUBLICATIONS

Itsuno, A. M. et al., "Design and Modeling of HgCdTe nBn Detector" Journal of Electronic Materials, vol. 40, No. 8, pp. 1624-1629, 2011 XP 019921471.
(Continued)

*Primary Examiner* — Yu-Hsi D Sun
*Assistant Examiner* — Wasiul Haider
(74) *Attorney, Agent, or Firm* — Oblon, McClelland, Maier & Neustadt, L.L.P.

(57) ABSTRACT

A semi-conducting structure, configured to receive an electromagnetic radiation and to transform the electromagnetic radiation into an electric signal, including: a first zone and a second zone of a same conductivity type and of same elements; a barrier zone, provided between the first and second zones, for acting as a barrier to majority carriers of the first and second zones on a barrier thickness, the barrier zone having its lowest bandgap energy defining a barrier proportion; and a first interface zone configured to interface the first zone and the barrier zone on a first interface thickness, the first interface zone including a composition of elements which is varied from a proportion corresponding to that of the first material to the barrier proportion, the first interface thickness being at least equal to half the barrier thickness.

11 Claims, 3 Drawing Sheets

Figure 1:
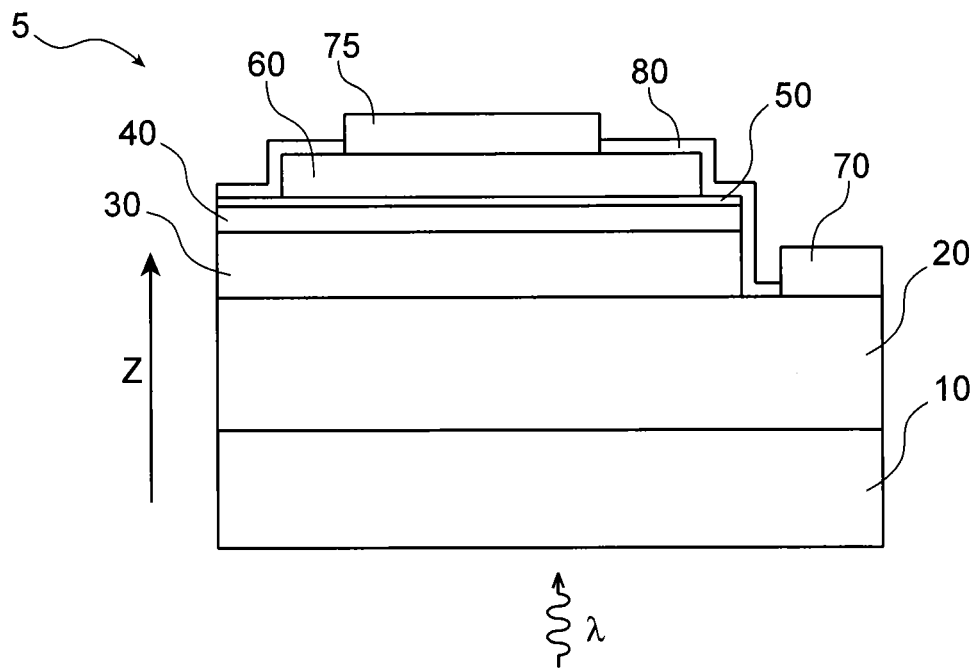

(51) Int. Cl.
*H01L 31/0296* (2006.01)
*H01L 31/101* (2006.01)

(56) References Cited

U.S. PATENT DOCUMENTS

2010/0230720 A1 9/2010 Wicks
2011/0095334 A1* 4/2011 Scott .............................. 257/188
2013/0168792 A1* 7/2013 Haddad et al. ................. 257/432

OTHER PUBLICATIONS

Piotrowski, J. et al."Dark currents, responsivity, and response time in graded gap HgCdTe structure" Proc. of SPIE, vol. 7660, pp. 766031-1-766031-8, 2010 XP 055044448.

Savic, G. R. et al."Use of unipolar barriers to block dark currents in infrared detectors" Proc. of SPIE, vol. 8012, pp. 80122T-1-80122T-10, 2011 XP 040562779.

International Search Report Issued Jul. 23, 2013 in PCT/EP13/050020 Filed Jan. 2, 2013.

French Search Report Issued Nov. 16, 2012 in French Patent Application No. 12 50086 Filed Jan. 4, 2012.

U.S. Appl. No. 14/402,020, filed Nov. 18, 2014, Boulard, et al.

U.S. Appl. No. 14/359,369, filed May 20, 2014, Gravrand, et al.

* cited by examiner

SEMICONDUCTOR STRUCTURE, DEVICE COMPRISING SUCH A STRUCTURE, AND METHOD FOR PRODUCING A SEMICONDUCTOR STRUCTURE

TECHNICAL FIELD

The invention relates to the field of detection and/or measurement of electromagnetic radiations and devices enabling such a detection and/or measurement.

The rapid advancement of optoelectronics, related to the suitability of microelectronic technologies to direct bandgap semi-conductors, enabled the development of devices enabling the detection and/or measurement of electromagnetic radiations which are compact in wavelength ranges from ultraviolet to infrared.

These devices generally implement semi-conducting structures able to receive an electromagnetic radiation and transform it into an electrical signal.

The invention more particularly relates to a semi-conducting structure able to receive an electromagnetic radiation and to transform it into an electrical signal, to a semi-conducting component including at least one such semi-conducting structure and to a method for manufacturing such semi-conducting structure.

STATE OF PRIOR ART

Semi-conducting structures able to receive an electromagnetic radiation and to transform it into an electrical signal are generally diode type semi-conducting structures intended to be reverse biased.

Such structures, when used for the detection and/or measurement of an electromagnetic radiation have a dark current. Such a dark current, corresponding to the current of the diode in operation when the structure is not subjected to an electromagnetic radiation, represents the main noise source of the structure and thus restricts the signal to noise ratio thereof, and thus the sensitivity. This dark current, at a low temperature, that is at a temperature lower than 170 K is essentially related to the space charge region. Indeed, this is the site for the current for generating and recombining electron-hole pairs, of the trap assisted tunnel current and the band to band tunnel current, which give rise to most of the low temperature dark current.

It is known, to restrict the low temperature dark current, the use of barrier type semi-conducting structures, that is semi-conducting structures including a first and a second zone of the same conductivity type separated by a barrier zone. The first zone and the second zone, having a same conductivity type, include identical majority carriers which are by definition the majority carriers of the structure. The barrier zone includes a band gap suitable to act as a barrier to the majority carriers and let pass the minority carriers. For this, the barrier zone has a bandgap energy higher than that of the first and second zones with an energy difference, between the different zones, as low as possible for the energy band corresponding to the minority carriers, that is, the valence band for minority carriers which are holes, and the conduction band, for minority carriers which are electrons. Thus, the barrier zone creates, through the difference in bandgap energy with the first and second zones, a strong potential barrier for the majority carriers. It is low, or even cancelled, for the minority carriers, because of the low energy difference for the energy band corresponding to the minority carriers.

In this way, when the first zone is reverse biased, with respect to the second zone, and an electron-hole pair is generated by a photon in the first zone, the minority carrier generated switches from the first zone to the second zone, and is accelerated by the bias. The minority carrier is thus collected at the same. Such a structure, by dispensing with the presence of the space charge region in the small gap material, also dispenses with the noise occurring in the space charge region, and thus has a low temperature dark current which is reduced with respect to a diode type structure.

However, if such a structure enables, for a low temperature operation, a reduced dark current to be obtained, such a structure is necessarily, because of the bandgap energy difference to which it uses for the barrier formation, a hetero-structure. The structure thus generally includes, for materials including different elements and thus having generally high lattice parameter differences, interface defects between the different zones of the structure. Such defects, giving potentially rise to noise, restrict the valve of such a structure.

It is known, as taught in particular in U.S. Pat. No. 4,679,063, to restrict the amount of interface defects, the use of materials consisting of the same elements, such as the $Cd_xHg_{1-x}Te$ mercury cadmium telluride type materials. Such materials have for proportions of different elements, lattice parameter differences generally reduced and can include, when these differences are high, a fine matching layer along which the proportion of elements is varied to reduce stresses, and thus the amount of defects, at the interfaces.

However, if a structure including such materials has a reduced density of interface defects, the materials used to form said structure, have to fulfil two criteria:
- the materials should have a strong bandgap energy variation as a function of the proportion of elements,
- the materials must offer, for at least one conductivity type, the possibility on a strong variation in the bandgap energy, of having a low energy difference for the energy band corresponding to the minority carrier.

The solution described in the document U.S. Pat. No. 4,679,063 to fulfil this second criterion is the use of a suitable doping of the barrier zone. This solution is difficult to implement for some materials fulfilling the first criterion, such as cadmium-mercury telluride, the adequate doping having technical constraints hardly compatible with industrial production.

DISCLOSURE OF THE INVENTION

The present invention aims at overcoming this drawback. One of the purposes of the invention is to provide a semi-conducting structure able to receive an electromagnetic radiation and to transform it into an electrical signal, of the barrier type, the semi-conductor materials of which from which the structure is made, consist of the same elements which, without requiring a doping type of the barrier zone different from that of the first and second zones is free, in operation, of potential barrier for the minority carriers, with the potential barrier for the majority carriers remaining active even for high reverse bias voltages of the structure.

To that end, the invention relates to a semi-conducting structure able to receive:
  a first and a second zone of a same conductivity type and respectively made of a first and a second semi-conductor material, said first and second semi-conductor materials both being constituted of the same elements, said elements being called constituent elements, a different proportion of at least two of these constituent elements corresponding to a bandgap energy difference of said material, the first material being a direct bandgap semi-conductor material, a barrier zone, provided between the first and second zones, for acting as a barrier to the majority carriers of the first and second zones on a barrier thickness, said barrier zone being constituted of constituent elements and having on the entire barrier thickness a proportion of constituent elements such that the barrier zone has a bandgap energy minimum higher than the bandgap the energy of the first zone and which is such that the difference in absolute value between the energy of the energy band extremum corresponding to the majority carrier for the bandgap energy minimum of the barrier zone and the energy of this same extremum of the second zone is equal to at least 10 times the heat energy at the operating temperature rating, the proportion of constituent elements for which the barrier zone has the lowest bandgap energy defining the barrier proportion, a first interface zone arranged to interface the first zone and the barrier zone on a first interface thickness, the first interface zone having a composition of constituent elements which is varied on the entire interface thickness and from the first zone to the barrier zone, of a proportion corresponding to that of the first material to the barrier proportion, the first interface thickness being at least equal to half the barrier thickness, and wherein is provided a second interface zone arranged to interface the barrier zone and the second zone on a second interface thickness, the second interface zone having a composition of constituent elements which is varied, on the entire second interface thickness and from the barrier zone to the second zone, of the barrier proportion to a composition corresponding to that of the second material, the second interface thickness being lower than half the barrier thickness.

By barrier zone, it is meant the zone of the structure on which the energy band extremum corresponding to the majority carrier has a difference with the conduction band bottom of the second zone which is equal to at least 10 times the heat energy at the maximum operating temperature. By extension, by barrier thickness, it is meant the thickness of the barrier zone.

By direct bandgap semi-conductor material, it is meant a semi-conductor material the valence band energy maximum and the conduction band energy minimum of which are located at a value of the wave vector k substantially equal in the energy scatter diagram of said semi-conductor material.

By operating temperature rating of the semi-conducting structure, it is meant the maximum temperature at which the semi-conducting structure is intended to operate by having a rated signal to noise ratio. Indeed, such structures, for example for the detection of far infrared applications, must operate at well defined temperatures, which are in this example around 80K, and has for higher temperatures, a degraded sensitivity related to a decreased signal to noise ratio. According to another example, a semi-conducting structure intended to operate at room temperature will have an operating temperature rating of 80° C., that is 353K.

This operating temperature rating defines a heat energy which corresponds to the average kinetic energy of the molecules at the temperature rating. This heat energy $E_T$ is defined by the Boltzmann's constant k with $E_T = kT$, where T is the temperature. By considering again the example of a semi-conducting structure for the detection of far infrared applications, a heat energy of about 7 meV is obtained.

Such a first interface zone by having along the first interface thickness, at least equal to half the barrier thickness, a variation in constituent elements between a proportion corresponding to that of the first zone and the barrier proportion, is able to, when the first zone is reverse biased with respect to the second zone, absorb part of the potential difference between the first and second zones, such that the deformation of the valence band induced by said part removes the potential barrier for minority carriers which is created by the bandgap energy difference between the barrier zone and the first and second zones. Thus, such a structure does not require a particular doping of the barrier zone such that the same does not have a potential barrier to the minority carrier during the reverse bias of the first zone with respect to the second zone.

The second interface zone, by having a low thickness with respect to both the barrier zone and the first interface zone, enables an abrupt potential barrier to be provided for the majority carriers with a reduced deformation of the barrier during the reverse bias of the first zone with respect to the second zone. The structure accepts with such a second interface zone, a reverse bias voltage of the first zone from which the deformation of the barrier is sufficient for the majority carriers to be likely to pass the barrier, which is high.

Thus, the structure with such first and second interface zones has in operation a potential barrier only for the majority carriers which remain active even for high reverse biases of the structure without the barrier zone having a conductivity type different from that of the first and second zones.

The structure can be a nBn structure, that is the first and second zones are of the conductivity type for which the majority carriers are electrons, the barrier zone being constituted of constituent elements and having on the entire barrier thickness a proportion of constituent elements such that the barrier zone has a minimum of bandgap energy higher than the bandgap energy of the first zone and which is such that the difference in absolute value between the energy of the energy band extremum corresponding to the majority carrier for the minimum of the bandgap energy of the barrier zone and the energy of the same extremum of the conduction band of the second zone is equal to at least 10 times the heat energy at the operating temperature rating.

Thus, the invention also relates to a semi-conducting structure of the nBn type able to receive an electromagnetic radiation and to transform it into an electrical signal, said structure including an operating temperature rating, such as structure including:

a first and a second zone of a same conductivity type as that for which the majority carriers are electrons, and respectively made of a first and a second semi-conductor material, said first and second semi-conductor materials both being constituted of the same elements, said elements being called constituent elements, a different proportion of at least two of these constituent elements corresponding to a bandgap energy difference of said material, the first material being a direct bandgap semi-conductor material, a barrier zone, provided between the first and second zones, for acting as a barrier to the majority carriers of the first and second zones on a barrier thickness, said barrier zone being constituted of the constituent elements and having on the entire barrier thickness a proportion of constituent elements such that the barrier zone has a minimum of bandgap energy higher than the bandgap energy of the first zone and which is such that the difference in absolute value between the energy of the energy gap extremum corresponding to the majority carrier for the minimum of the bandgap energy of the barrier zone and the energy of the same extremum of the conduction band of the second zone is equal to at least 10 times the heat energy at the operating temperature rating, the proportion of constituent elements for which the barrier zone has the lowest energy gap defining the barrier proportion, a first interface zone arranged to interface the first zone and the barrier zone on a first interface thickness, the first interface zone having a composition of constituent elements which is varied, on the entire interface thickness and from the first zone to the barrier zone, from a proportion corresponding to that of the first material to the barrier proportion, the first interface thickness being at least equal to half the barrier thickness, and wherein is provided a second interface zone arranged to interface the barrier zone and the second zone on a second interface thickness, the second interface zone having a composition of constituent elements which is varied, on the entire interface thickness and from the barrier zone to the second zone, from the barrier proportion to a composition corresponding to that of the second material, the second interface thickness being lower than half the barrier thickness.

The first interface thickness can be equal to or higher than the barrier thickness.

The first and second materials can have substantially identical proportions of constituent elements.

The first and second materials thus have substantially the same bandgap energy making the passing of minority carriers from the first to the second zone easier.

According to a particular application of the invention, the constituent elements are cadmium, mercury and tellurium.

Such constituent elements are particularly suitable for the detection and measurement at low temperature of an electromagnetic radiation in the infrared range, the variation in the cadmium and mercury proportion enabling the variation, for an operating temperature of 80 K, of the bandgap energy in a value ranging from 0 eV to more than 1.6 eV that is, for a given concentration of majority carriers, a difference between the bottoms of the corresponding conduction bands of about 1.2 eV. Furthermore, such constituent elements also enable materials with similar lattice parameters to be formed throughout the variation range in the proportion of constituent elements, thus restricting the appearance of interface defects upon manufacturing such a structure.

The first interface thickness can be between once the barrier thickness and twice the barrier thickness.

Such a structure has an interface thickness sufficiently wide for, during the application of reverse bias of the first zone with respect to the second zone, the potential barrier for the majority carriers to be cancelled even for a low reverse bias of the first zone with respect to the second zone.

The proportion of constituent elements can be substantially evenly varied on the entire interface thickness.

With such a variation in the proportion of constituent elements, the first interface zone has a continuous variation in the bandgap energy and thus in the energy of the energy band corresponding to the minority carriers, this variation enabling a significant deformation of the valence band.

The proportion of constituent elements can be substantially linearly varied on the entire interface thickness.

According to another possibility of the invention, the proportion of constituent elements can be substantially varied according to an error function, also known as the Gauss' error function, on the entire interface thickness.

Such a variation in the proportion corresponds to an inter-diffused linear gradient of one of the constituent elements.

A second interface zone can be provided, arranged to interface the barrier zone and the second zone on a second interface thickness, the second interface zone having a composition of constituent elements which is varied, on the entire second interface thickness and from the barrier zone to the second zone, from the barrier proportion to a proportion corresponding to that of the second material, the second interface thickness being lower than half the barrier thickness.

The second interface thickness can be lower than one third of the barrier thickness and preferentially lower than one tenth of the barrier thickness.

Such a second interface zone, by having a particularly low thickness with respect to both the barrier zone and the first interface zone, enables an abrupt potential barrier to be provided for majority carriers with a reduced deformation of the barrier during the reverse bias of the first zone with respect to the second zone. Thus, the structure accepts a reverse bias voltage of the first zone from which the deformation of the barrier is sufficient for the majority carriers to be likely to pass the barrier, which is higher.

The barrier thickness is between 100 and 300 nm.

Such a thickness enables both a sufficiently wide potential barrier to be provided to restrict the tunnel current through the barrier and thus block the passing of majority carriers between the second zone and the first zone, while being sufficiently thin to be quickly depleted during the reverse bias of the first zone with respect to the second zone.

The invention also relates to a semi-conducting device, including a plurality of semi-conducting structures, at least one of the structures being a structure according to the invention.

Such a device enables the detection and/or measurement of a low temperature electromagnetic radiation with at least one of the structures which, being made of semi-conductor materials being constituted of the same constituent elements and not requiring a doping type of the barrier zone different from that of the first and second zones, does not have, in operation, a potential barrier for minority carriers.

An optical part and a processing part can be provided, the optical part including the plurality of semi-conducting structures, called optical structures, able to receive an electromagnetic radiation and to transform it into an electrical signal, at least one of the structures being at least one structure according to the invention, the processing part including semi-conducting structures arranged between them to process the electrical signals of the optical structures.

The placement of the optical semi-conducting structures on an optical part of the component and the placement of the semi-conducting structures for processing signals from the optical structures on an another part of the component than the optical part enable the combination on a same component of the advantages of optical structures made of semi-conductor materials optimised for the detection and/or measurement of the electromagnetic radiation to be detected, with the advantages of structures suitable for processing electrical signals of optical semi-conducting structures made of a material suitable for such processing such as for example silicon.

The invention also relates to a method for manufacturing a semi-conducting structure according to the invention, and including the steps of:

providing a first zone of a first conductivity type and made of a first semi-conductor material, the first material being constituted of so-called constituent elements, such that a different proportion of at least two of said constituent elements corresponds to a variation in the bandgap energy of said material, forming a first interface zone in contact with the first zone, the first interface zone having a first interface thickness and a composition of constituent elements which is varied on the entire interface thickness from a proportion corresponding to that of the first material to a barrier proportion, forming a barrier zone in contact with the interface zone such that the interface zone interfaces the first zone and the barrier zone, the barrier zone having a barrier thickness at least lower than twice the first interface thickness, the barrier zone being constituted of constituent elements and having on the entire barrier thickness a proportion such that the barrier zone has a bandgap energy higher than that of the first zone, the proportion of constituent elements for which the barrier zone has the lowest bandgap energy being equal to the barrier proportion, forming a second interface zone on a second interface thickness, this second interface zone being arranged to interface the barrier zone and the second zone, the composition of constituent elements of the second interface zone being varied from the barrier proportion to a proportion corresponding to that of the second material, the second interface thickness being lower than half the barrier thickness, and preferentially lower than 10 times the barrier thickness, forming a second zone of the same conductivity type as the first zone, the second zone being made of a second semi-conductor material being constituted of the constituent elements, the second zone being arranged such that a barrier zone is provided between the first and second zones, the bandgap energy of the second zone being such that the difference in absolute value between the energy of the energy band extremum corresponding to the majority carrier for the bandgap energy minimum of the barrier zone and the energy of the same extremum of the second zone is equal to at least 10 times the heat energy at the operating temperature rating.

Such a method enables the formation of a structure able to receive an electromagnetic radiation and to transform it into an electrical signal without said structure requiring, to be operating, a doping type of the barrier zone which is different from that of the first and second zones. Further, such a method enables a structure with an abrupt potential barrier to be provided for the majority carriers and a reduced barrier deformation during the reverse bias of the first zone with respect to the second zone. Thus, such a structure accepts a reverse bias voltage of the first zone from which the deformation of the barrier is sufficient for the majority carriers to be likely to pass the barrier, which is higher.

Thus, such a method enables the formation of a structure which, with such first and second interface zones, has in operation a potential barrier only for the majority carriers which remains active even for high reverse biases of the structure without the barrier zone having a conductivity type different from that of the first and second zones.

In the step of forming the second zone, the second zone can be made of a second semi-conductor material being constituted of the constituent elements, the second zone being arranged such that the barrier zone is provided between the first and second zones, the bandgap energy of the second zone being such that the difference in absolute value between the energy of the energy band extremum corresponding to the majority carrier for the minimum of the bandgap energy of the barrier zone and the energy of the same extremum of the conduction band of the second zone is equal to at least 10 times the heat energy at the operating temperature rating.

BRIEF DESCRIPTIONS OF THE DRAWINGS

Figure 2:
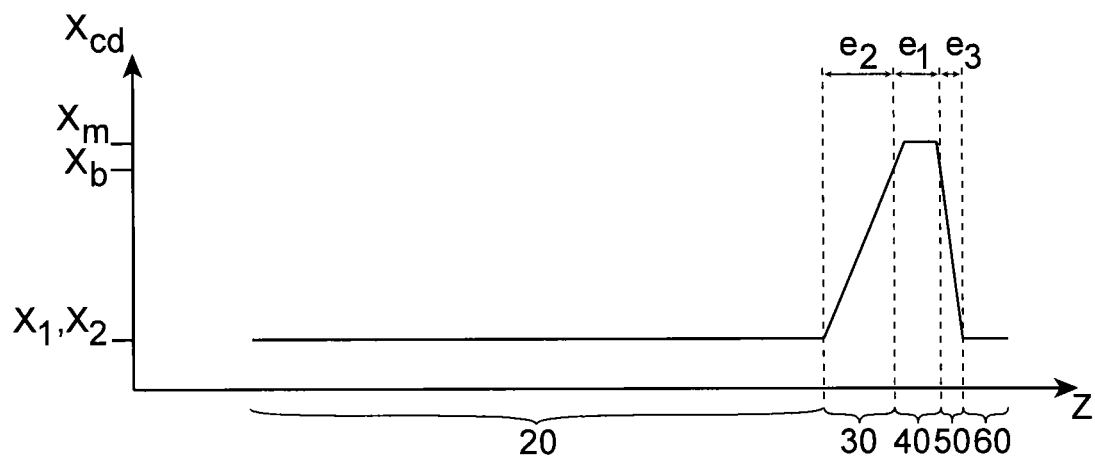
Figure 3A:
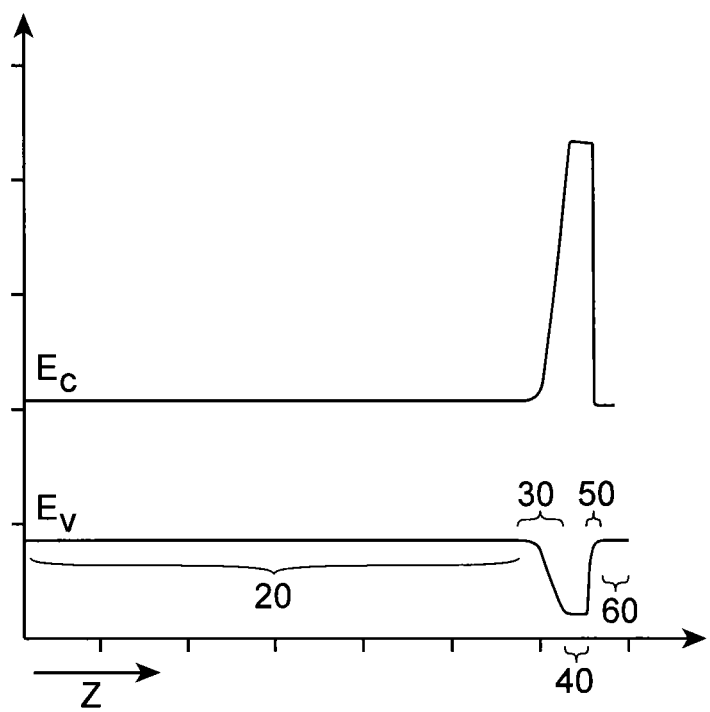
Figure 3B:
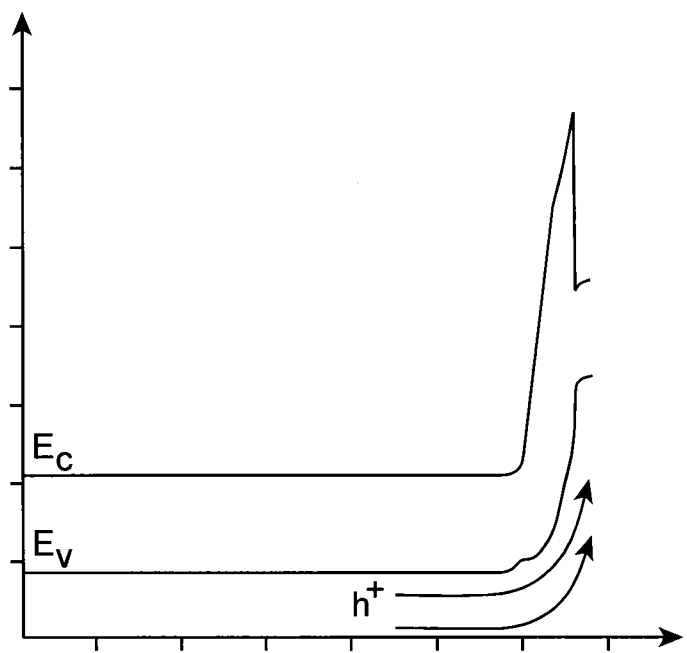
Figure 4:
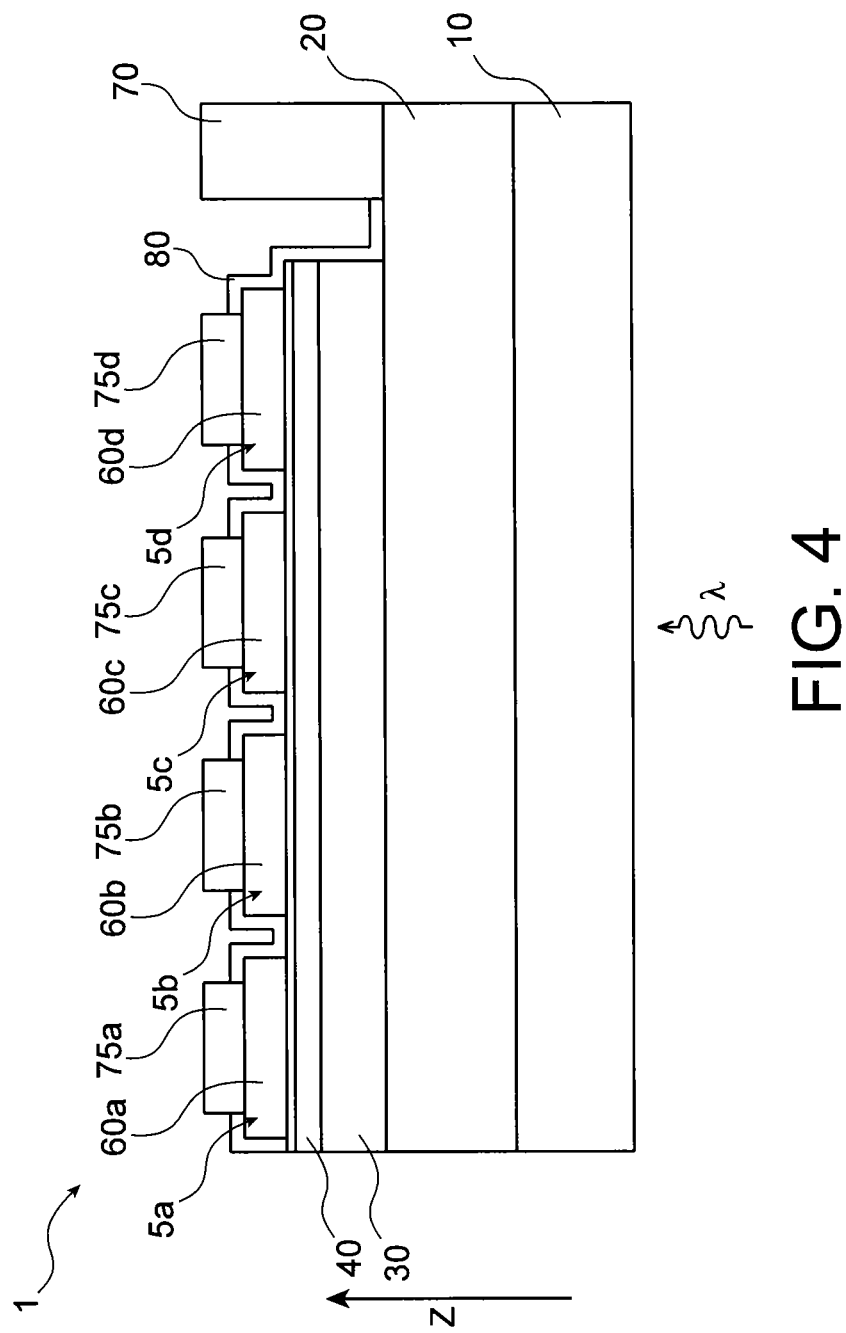

The present invention will be better understood upon reading the description of exemplary embodiments, given by way of indicating purposes and in no way limiting, in reference to the appended drawings wherein:

FIG. 1 illustrates an exemplary structure according to the invention in a schematic cross section view FIG. 2 is a graph representing the variation in the cadmium proportion along the z axis of the structure illustrated in FIG. 1, FIGS. 3a and 3b are energy band diagrams of the structure illustrated in FIG. 1, respectively, in the absence of bias and during a reverse bias of the first zone with respect to the second zone, FIG. 4 illustrates a schematic cross section view of an optical part of a semi-conducting component according to the invention.

Identical, similar or equivalent parts of the different figures bear the same reference numerals so as to facilitate switching from one figure to the other.

The different parts represented in the figures are not necessarily drawn to a uniform scale, to make the figures easier to understand.

DETAILED DISCLOSURE OF PARTICULAR EMBODIMENTS

FIG. 1 illustrates a semi-conducting structure 5 able to receive an electromagnetic radiation and to transform it into an electrical signal. The structure 5 includes an operating temperature rating below which it has a rated signal to noise ratio.

Such a structure 5 can be suitable for detecting and/or measuring an electromagnetic radiation $\lambda$ the wavelength of which is within the wavelength range from ultraviolet to infrared. The values which are indicated in the continuation of this document are adapted to detection and/or measurement application of an infrared radiation $\lambda$. Such values are provided for purely illustrating purposes of a particular application of the invention. This particular application is called in the continuation of this document, particular application of the invention.

Such a structure 5 includes:

a semi-conducting support 10, a first semi-conducting zone 20 in contact with the support 10, the first zone 20 being provided with a first electrical contact 70 and being made of a first material, a first interface zone 30 in contact with the first zone 20, the first interface zone 30 having a first interface thickness $e_2$, a barrier zone 40 in contact with the first interface zone 30, the barrier zone 40 having a barrier thickness $e_1$, a second interface zone 50 in contact with the barrier zone 40, the second interface zone 50 having a second interface thickness $e_3$, a second semi-conducting zone 60 in contact with the second interface zone 50, the second zone 60 being provided with a second electrical contact 75 and being made of a second material, and a surface passivation layer 80 suitable for passivating the surface of the structure 5 other than the first and second electrical contact 70, 75, said passivation layer also acting as an electrical insulation.

The first zone 20, the first interface zone 30, the barrier zone 40, the second interface zone 50 and the second zone 60 are made from the same so-called constituent elements.

The constituent elements are selected such that two semi-conductor materials, including a different proportion in at least two of the constituent elements, have a different bandgap energy. The range on which the bandgap energy can be varied has to be such that the bandgap energy difference between a material including the proportion of constituent elements providing the lowest bandgap energy and a material including the proportion of constituent elements providing the greatest bandgap energy is suitable for forming a potential barrier for at least one conductivity type.

Such a condition is fulfilled, for example, with constituent elements the energy difference of which between the bottom of the conduction band for the minimum and maximum respectively of the bandgap energy which can be obtained by varying the proportion of constituent elements, is at least equal to at least 10 times the heat energy at the maximum operating temperature (for majority carriers which are electrons and a majority carrier concentration identical in the first and second zones, as well as in the barrier zone). The constituent elements are cadmium Cd, mercury Hg and tellurium Te with materials the composition of which is of the $Cd_xHg_{1-x}Te$ type. Such constituent elements enable the latter condition to be fulfilled. Indeed, for an operating temperature rating of 80 K, two materials of the $Cd_xHg_{1-x}Te$ type, having a cadmium proportion X of 0.18 and 1 respectively, the difference is about 1.2 eV. The heat energy being at 80 K of about 7 meV, the difference which can be obtained is much higher than 10 times the heat energy, that is about 70 meV.

This is also true for higher temperatures. Thus, at room temperature, the heat energy is about 26 meV, that is a difference which should be higher than 260 meV. This value is also accessible with the constituent elements which are cadmium Cd, mercury Hg and tellurium Te.

Subsequently, for the particular application of the invention, by proportion of constituent elements, it is meant the proportion of cadmium, the latter directly giving the proportion of mercury and tellurium, the materials making up a structure according to the particular application according to the invention being of the $Cd_xHg_{1-x}Te$ type, X being the proportion of cadmium.

The semi-conducting support 10 is a semi-conductor material suitable for growing the material forming the first zone 20. Thus, for the particular application of the invention for which the constituent elements are cadmium Cd, mercury Hg and tellurium Te, the semi-conducting support is, for example, cadmium and zinc telluride (CdZnTe).

The semi-conducting support 10 is, as illustrated in FIG. 1, a substantially flat support having a first and a second face.

The first zone 20 is in contact with the second face of the support 10. The first zone 20 is a substantially planar layer one face of which is in contact with the support 10.

The first zone 20 is made of the first material. The first material is constituted of constituent elements. The first material is a direct gap semi-conductor material. The gap energy of the first material is adapted to the wavelength of the electromagnetic radiation λ to be detected and/or measured. This adaption to the bandgap energy of the first material is achieved by a proportion of constituent elements $X_1$ suitable for the bandgap energy of the first material to correspond to an energy lower than that of the electromagnetic radiation λ to be detected.

The first material has a first conductivity type for majority carriers and minority carriers. Subsequently, by majority carriers and minority carriers, it is meant the carriers which are the majority and minority ones in the first material respectively.

The first electrical contact 70 is an electrical contact adapted to the first material and conductivity type it has.

According to the particular application of the invention, the first material can include, for a structure suitable for detecting and/or measuring an electromagnetic radiation λ in the range of mid-wavelength infrared lower than 3 μm, a proportion of constituent elements $X_1$ equal to 0.4, and for detecting and/or measuring an electromagnetic radiation λ in the range of mid-wavelength infrared lower than 5 μm, a proportion of constituent elements $X_1$ equal to 0.3. For a detection and/or measurement of an electromagnetic radiation λ in the range of far infrared lower than 10 μm, the proportion of constituent elements $X_1$ of the first material is equal to 0.22.

According to this same particular application, the first material has a conductivity such that the majority carriers of the first zone 20 are electrons, the minority carries being thus holes $h^+$. Such a conductivity type is achieved by doping the first material from doping constituent elements providing an electron excess, such as indium (In). The concentration of majority carriers is between $5.10^{14}$ and $5.10^{15}$ cm$^{-3}$.

According to the particular application of the invention, the first electrical contact 70 is a gold contact, such a contact being adapted to electrically contact a $Cd_xHg_{1-x}Te$ type material.

The first zone 20, being the zone of the structure adapted to absorb the electromagnetic radiation λ, has a thickness suitable for such an absorption. Thus, for the particular application of the invention, the thickness of the first zone 20 is at least equal to 2 μm and is preferentially in the order of the wavelength for which the structure is adapted.

Above and in the rest of this document, by thickness of a zone of the structure, it is meant the dimension of the zone along an axis extending from the first zone to the second zone. Such an axis is, according to the embodiment illustrated in FIG. 1 and for each of the zones, substantially perpendicular to an interface surface with another zone with which the zone is in contact. This axis is, for the embodiment described in this document, the z axis represented in FIG. 1.

The first zone 20 has a face in contact with the support 10 and a face opposite the support 10.

The first interface zone 30 is in contact with the first zone 20 on the face of the first zone opposite the support 10. The first interface zone 30 is a substantially planar layer in contact with the first zone 20 at the face of the first zone 20 which is opposite the support 10.

The first interface zone 30 has a composition of constituent elements which is varied from the first zone 20 to the barrier zone 40, on the entire interface thickness $e_2$ and from the first zone 20 to the barrier zone 40, from a proportion corresponding to that of the first material $X_1$ to a barrier proportion $X_b$.

The proportion of constituent elements in the first interface zone 30 is substantially evenly varied on the entire interface thickness $e_2$.

The proportion of constituent elements in the first interface zone 30 is varied, as illustrated in FIG. 2, substantially linearly on the entire interface thickness $e_2$.

The first interface zone 30 has a face in contact with the first zone 20 and a face, which being opposite the face in contact with the first zone 20, is in contact with the barrier zone 40.

The barrier zone 40 is a zone of the structure 5 which is for acting as a barrier to the majority carriers of the first and second zones 20, 60. The barrier zone 40 is a substantially planar layer.

The barrier thickness $e_1$ is the thickness for which the barrier zone 40 has a bandgap energy such that the difference in absolute value between the energy of the energy band extremum corresponding to the majority carrier for the bandgap energy minimum of the barrier zone and the energy of this same extremum of the conduction band of the second zone is equal to at least 10 times the heat energy at the operating temperature rating.

The barrier thickness $e_1$ has a sufficiently wide dimension for the barrier zone to act as a barrier to the majority carriers and blocks the passing of majority carriers between the second zone 60 and the first zone 10. The barrier thickness $e_1$ is also sufficiently low to allow a quick depletion of the barrier zone during a reverse bias of the first zone 20 with respect to the second zone 60.

The barrier proportion $X_b$ is the proportion of constituent elements necessary for the bandgap energy of a material including the barrier proportion $X_b$ such that the difference in absolute value between the energy of the energy band extremum corresponding to the majority carrier for the bandgap energy minimum of the barrier zone and the energy of this same extremum of the conduction band of the second zone is equal to at least 10 times the heat energy at the operating temperature rating.

The proportion of constituent elements in the barrier zone varies, as illustrated in FIG. 2, between the barrier proportion $X_b$ and a maximum width proportion $X_m$ The maximum width proportion $X_m$ is the proportion of constituent elements for which the barrier zone 40 has a maximum bandgap energy.

According to the particular application of the invention, the barrier proportion $X_b$ and the maximum width proportion $X_m$ are respectively equal to 0.8 and 0.85, for a structure suitable for detecting an electromagnetic radiation λ in the range of mid-wavelength infrared lower than 3 μm (X1=0.4), and to 0.6 and 0.65 for detecting an electromagnetic radiation λ in the range of mid-wavelength infrared lower than 5 μm (X1=0.3). For a detection in the range of far infrared lower than 10 μm (X1=0.22), the barrier proportion $X_b$ and the maximum width proportion $X_m$ are respectively equal to 0.55 and 0.6. The operating temperature ratings for structures according to these particular applications being respectively 80 K, 120 K and 170 K for the detection in the range of near infrared, mid-wavelength infrared and far infrared, the criterion at 10 times kT is widely fulfilled in each of these configurations, even for higher temperatures (close to room temperature).

The barrier zone 40 has along the barrier thickness $e_1$, and from the first interface zone 30 and to the second barrier zone 50, successively:
  a first part along which the proportion of constituent elements is linearly varied from the barrier proportion $X_b$ to the maximum width proportion $X_m$,
  a second part along which the proportion of constituent elements is substantially constant and equal to the maximum width proportion $X_m$,
  a third and last part along which the proportion of constituent elements is linearly varied from the maximum width proportion $X_m$ to the barrier proportion $X_b$.

So as to have an efficient potential barrier, the second part represents most of the barrier zone 40.

According to the particular application of the invention, the barrier thickness $e_1$ is between 100 and 300 nm, preferentially equal to 300 nm.

The barrier zone 40 has a face in contact with the interface zone 30 and a face which, being opposite the face in contact with the interface zone 30, is in contact with the second interface zone 50.

The second interface zone 50 is a substantially planar layer in contact with the barrier zone 40 at the face of the barrier zone 40 which is opposite the first interface zone 30.

The second interface zone 50 has a composition of constituent elements which is varied on the entire interface thickness $e_3$ and from the barrier zone 40 to the second zone, from a proportion corresponding to that of the barrier proportion $X_b$ to a proportion corresponding to a second material $X_2$.

The proportion of constituent elements in the second interface zone 50 is substantially evenly varied on the entire second interface thickness $e_3$. The proportion of constituent elements in the second interface zone 50 is varied, as illustrated in FIG. 2, substantially evenly on the entire interface thickness $e_3$.

The second interface thickness $e_3$ is as low as possible and is lower than one third of the barrier thickness $e_1$ and preferentially lower than one tenth of the barrier thickness $e_1$.

According to the particular application of the invention, the barrier thickness $e_1$ is lower than 30 nm.

The second interface zone 50 has a face in contact with the barrier zone 40 and a face which, being opposite the face in contact with the barrier zone, is in contact with the second zone 60.

The second zone 60 is a substantially planar layer in contact with the second interface zone 50 at the face of the second interface zone 50 which is opposite the barrier zone 40.

The second zone 60 is made of the second material the proportion of constituent elements $X_2$ of which is, as illustrated in FIG. 2, substantially identical to the proportion of constituent elements $X_1$ of the first material.

The second material has a conductivity type and a concentration of majority carriers substantially identical to those of the first material.

The second zone 60 is provided with the second electrical contact 75 suitable for enabling a bias of the second zone 60 and thus suitable for the second material.

According to the particular application of the invention, the second electrical contact 75 is a titanium and/or gold contact, such a contact being suitable for a $Hg_xCd_{1-x}Te$ type material.

The structure 5 is provided with a surface passivation layer 80 on the surfaces of the structure 5 other than the first and second electrical contacts 70, 75, this surface passivation layer 18 also having an electrical insulation function for the surfaces of the structure 5.

According to the particular application, the surface passivation 80 is made of cadmium telluride CdTe or zinc sulphide Zns.

Such a structure 5, when it is a structure according to the particular application of the invention, has without a bias a band structure such as illustrated in FIG. 3a.

The first zone has a constant energy gap on its entire thickness, the bandgap energy of which is slightly lower than the energy of the electromagnetic radiation λ to be detected and/or measured.

The first interface zone 30, because of the variation in the proportion of constituent elements along the first interface thickness $e_2$, has a bandgap energy which increases on the entire first interface thickness $e_2$. Since the constituent elements are mercury, cadmium and tellurium, the widening of the bandgap energy, related to the increased proportion of cadmium, is asymmetrical, nearly 20% of the increase being distributed on the valence band and nearly 80% of the increase being distributed on the conduction band.

In the barrier zone, the bandgap energy quickly increases to reach a maximum bandgap energy. The maximum bandgap energy being reached, the barrier zone 40 has on most of the barrier thickness $e_1$ a substantially constant bandgap energy.

The band structure of the barrier zone, mainly corresponding to an offset of the conduction band Ec towards the high energies with respect to the first and second zones, a potential barrier is formed for the electrons which are the majority carriers. The band structure also has an offset in valence band Ev towards the low energies with respect to the first and second zone, therefore a potential barrier is also formed for the holes which are the minority carriers. The barrier zone thus has, and because of the offset asymmetry for the conduction and valence bands, a strong and low potential barrier for the electrons and holes respectively.

On the end of the barrier thickness, the bandgap energy is reduced to reach the bandgap energy value corresponding to a material having the barrier proportion $X_b$.

In the second interface zone 50, the variation in the proportion of constituent elements along the second interface thickness $e_3$ results in a decreased bandgap energy on the entire second interface thickness $e_3$. Because of the suitability of the second interface thickness $e_3$, the variation in the bandgap energy is abrupt with respect to the variation in the first interface zone 30.

The second interface zone 50 has a bandgap energy substantially identical to that of the first zone 20, this to facilitate in operation the switching of minority carriers from the first to the second zone 20, 60.

Upon implementing a structure 5 according to the invention, the first zone 20 is reverse biased with respect to the second zone 60, this bias being performed by means of the first and second electrical contacts 70, 75. Such as structure 5, by having during this bias a band structure of the same type as that illustrated in FIG. 3b, is able to detect an electromagnetic radiation λ. Indeed, for any electron-hole pair generated in the first zone 20, the minority carrier of the pair is accelerated by the potential difference applied between the first and second zones 20, 60 and is directly collected by the electric field developing in the barrier 40 and its interface 30. Indeed, the majority carrier does not meet a potential barrier when passing the barrier zone.

FIG. 3b, relating to a structure 5 according to the particular application of the invention enables the operation to be better understood.

For such a structure 5, the voltage applied to enable the measurement and/or detection of an infrared electromagnetic radiation λ has to be in the order of a few hundred millivolts. In FIG. 3b, it can be observed that during the reverse bias of the first zone with respect to the second zone, the potential variation is mainly transferred in the first interface zone 30 and the barrier zone 40.

As a result, therefore, in the first interface zone 30 and in the barrier zone 40, there is a rise of the valence and conduction bands to the high energies. This rise, for the first interface zone 30 and from an operating threshold voltage, sufficiently deforms the valence band to remove the potential barrier for the minority carriers. The deformation of the conduction and valence bands at the second interface zone 50 remaining reduced, the barrier zone continues to form a potential barrier preventing any current of majority carriers between the second zone 60 and the first zone 20.

Thus, in the absence of an electromagnetic radiation λ, no current of majority carriers transits through the structure 5. Upon exposing the structure 5 to an electromagnetic radiation λ with sufficient energy, an electron-hole pair being generated in the first zone 20 by a photon, the hole of the pair is accelerated and passes, without meeting the potential barrier, in the second zone 60 wherein it is collected. Thus generated current, with a suitable electronics, enables the electromagnetic radiation λ to be detected and/or measured.

A structure 5 according to the particular application can be made according to a manufacturing method including the steps of:
  providing a semi-conducting support 10 of cadmium and zinc telluride (CdZnTe),
  depositing onto the support 10 the constituent elements so as to form a layer of the first material forming the first zone 20,
  depositing onto the first zone 20 the constituent elements so as to form the first interface zone 30, the constituent elements being deposited as a layer and with a composition of constituent elements which is varied from the proportion $X_1$ corresponding to the first material to the barrier proportion $X_b$, on the first interface thickness $e_1$,
  depositing onto the first interface zone 30 the constituent elements so as to form the barrier zone 40, the constituent elements being deposited as a layer the thickness of which is the barrier thickness $e_1$, the proportion of constituent elements in the barrier zone 40 being comprised between the barrier proportion $X_b$ and the maximum width proportion $X_m$,
  depositing onto the barrier zone 40 the constituent elements so as to form the second interface zone 50, the constituent elements being deposited to form a layer and with a proportion of constituent elements which is varied from the barrier proportion $X_b$ to the proportion corresponding to the second zone $X_2$, on the second interface thickness $e_3$,
  depositing onto the second interface zone 50 the constituent elements so as to form a layer of the second material forming the second zone 60,
  forming the first and second electrical contacts 70, 75 on the first and second zones 60, respectively,
  depositing the surface passivation 80 onto the surfaces of the structure other than the metal contacts 70, 75.

For the particular application of the invention, the steps consisting of depositing the constituent elements can be performed by a molecular beam epitaxy or metal-organic vapour phase epitaxy deposition.

II can also be noted that so as to define the conductivity type and concentration of majority carriers in the zones 10, 20, 30, 40, 50, 60 of the structure, the doping elements are deposited concomitantly to the deposition of the constituent elements upon forming the different zones 10, 20, 30, 40, 50, 60. According to the type of doping elements, the method for manufacturing the structure 5 can include a step of activating doping elements, such as for example a heat annealing step.

The invention also relates to a device 1, such as that illustrated partly in FIG. 4, including structures 5a, 5b, 5c, 5d according to the invention.

Such a device 1 includes a first so-called optical part 2, and a second so-called processing part, not illustrated.

The optical part 2, illustrated in FIG. 4, has four structures 5a, 5b, 5c, 5d according to the invention.

The optical part 2 comprises:
  a semi-conducting support 10 common to all the structures 5a, 5b, 5c, 5d,
  a first semi-conducting zone 20 in contact with the semi-conducting support 10, the first zone having a first electrical contact 70 and being made of the first material, said first zone 20 being common to all the structures 5a, 5b, 5c, 5d,
  a first interface zone 30 in contact with the first zone 20, said first interface zone 30 being common to all the structures 5a, 5b, 5c, 5d,
  a barrier zone 40 in contact with the first interface zone 30, the barrier zone 40 being common to all the structures 5a, 5b, 5c, 5d
  a second interface zone 50 in contact with the barrier zone 40, the second interface zone 50 being common to all the structures 5a, 5b, 5c, 5d,
  a second semi-conducting zone 60a, 60b, 60c, 60d per structure in contact with the second interface zone 50, each second zone 60a, 60b, 60c, 60d having a second electrical contact 75a, 75b, 75c, 75d and being made of a second material, and a surface passivation layer 80 suitable for passivating the surface of the optical part 2 other than the first and second electrical contacts 70, 75a, 75b, 75c and 75d.

The structures 5a, 5b, 5c, 5d of the optical part 2 using an identical operating principal to the structure 5 previously described, the different zones 10, 20, 30, 40, 50, 60a,b,c,d of the optical part 2 having identical features to those of the structure previously described.

To allow an indium hybridation of the optical part 2 on the processing part of the device, all the electrical contacts of the optical part 2 are arranged so as to define an hybridation plan suitable to enable a connexion by indium hybridation, of the optical part to the processing part, in order to form the device.

The processing part is a part including semi-conducting structures interconnected together to form processing circuits suitable for processing electrical signals of the optical structures 5a, 5b, 5c, 5d. Such a processing part uses transistor type structures and is made of silicone. The processing part also includes electrical contacts suitable for enabling the connexion to the optical part by indium hybridation. Thus, such a device enables the combination of the advantages of the use of an optical semi-conductor material, such as the $Cd_xHg_{1-x}Te$ with those of the processing by a low noise quick electronics provided by silicone structures.

The implementation of such a device 1, for its optical part, is similar to the structure according to the invention.

The method for manufacturing such a device 1 is similar to that of a structure 5 according to the invention except for the implementation of steps of masking related to making second zones 60a,b,c,d and their second electrical contact which are specific to each of the optical structures 5a,b,c,d.

If, in the embodiment described above, a structure 5 according to the invention has a barrier zone 40 having three parts with the second part which, representing most of the barrier zone, has a substantially constant proportion of elements, the barrier zone 40 can include any proportion variation of constituent elements on most of the barrier thickness $e_1$, without departing from the scope of the invention. According to this possibility, the proportion variation of constituent elements along the barrier thickness $e_1$ has to be such that the bandgap energy on the entire barrier zone 40 is equal to or higher than the bandgap energy corresponding to the barrier proportion $X_b$.

If in the embodiment described above a structure 5 according to the invention has a proportion of constituent elements $X_2$ in the second material substantially identical to the proportion of constituent elements $X_1$ in the first material, the proportion of constituent elements $X_2$ in the second material can be different from that of the first material without departing from the scope of the invention.

In the particular application of the invention, the majority carriers are electrons and the structure is a nBn type structure (n for the doping type of the first and second zones and B for barrier). A structure according to the invention can also, without departing from the scope of the invention, have a conductivity type for which the majority carriers are holes, the structure being, according to this possibility, a pBp type structure (p for the doping type of the first and second zones and B for barrier).

Further, if in the embodiment described in this document, the first and second interface zones each have a proportion variation of constituent elements along the respective thickness which is linear, the proportion variation of elements of at least one of the first and second zones can have a variation other than linear without departing from the scope of the invention.

If in the embodiment described in this document, the proportion of constituent elements is linearly varied in the first and second interface zones, it is worth considering, without departing from the scope of the invention, that the proportion of constituent elements of either or both interface zones is varied other than linearly. Thus, it is also worth considering that for either or both interface zones, the proportion of constituent elements is varied according to an error function, also known as Gauss' error function.

The invention claimed is:

1. A semi-conducting structure configured to receive an electromagnetic radiation and to transform the electromagnetic radiation into an electrical signal, the structure having an operating temperature rating, the structure comprising:

a first zone and a second zone of a same conductivity type and respectively made of a first and a second semi-conductor material, the first and second semi-conductor materials both being constituted of same constituent elements, a different proportion in at least two of the constituent elements corresponding to a bandgap energy difference of the material, the first semi-conductor material being a direct bandgap semi-conductor material;

a barrier zone, provided between the first and second zones, acting as a barrier to majority carriers of the first and the second zones on a barrier thickness, the barrier zone constituted of the constituent elements and including on an entire barrier thickness a proportion of constituent elements such that the barrier zone has a bandgap energy minimum higher than a bandgap energy of the first zone and such that a difference in absolute value between an energy of an energy band extremum corresponding to the majority carrier for the bandgap energy minimum of the barrier zone and an energy of same extremum of the second zone is equal to at least 10 times heat energy at the operating temperature rating, a proportion of constituent elements for which the barrier zone has a lowest bandgap energy defining a barrier proportion;

a first interface zone configured to interface the first zone and the barrier zone on a first interface thickness, the first interface zone having a composition of constituent elements which is varied on an entire interface thickness and from the first zone to the barrier zone, from a proportion corresponding to that of the first semi-conductor material to the barrier proportion, the first interface thickness being at least equal to half the barrier thickness; and a second interface zone configured to interface the barrier zone and the second zone on a second interface thickness, the second interface zone having a composition of constituent elements which is varied, on an entire second interface thickness and from the barrier zone to the second zone, of the barrier proportion to a composition corresponding to that of the second material, the second interface thickness being lower than half the barrier thickness.

2. The structure according to claim 1, wherein the structure is a nBn structure, and the first and second zones are of conductivity type for which a majority carriers are electrons, the barrier zone being constituted of the constituent elements and having on the entire barrier thickness a proportion of constituent elements such that the barrier zone has a bandgap energy minimum higher than the bandgap energy of the first zone and such that the difference in absolute value between the energy of the energy band extremum corresponding to the majority carrier for the bandgap energy minimum of the barrier zone and the energy of same extremum of the conduction band of the second zone is equal to at least 10 times heat energy at the operating temperature rating.

3. The structure according to claim 1, wherein the first and second semi-conductor materials have substantially identical proportions of constituent elements.

4. The structure according to claim 1, wherein the constituent elements are cadmium (Cd), mercury (Hg), and tellurium (Te).

5. The structure according to claim 1, wherein the first interface thickness is between one times the barrier thickness and twice the barrier thickness.

6. The structure according to claim 1, wherein the proportion of constituent elements is substantially evenly varied on the entire first interface thickness.

7. The structure according to claim 1, wherein the second interface thickness is lower than the third of the barrier thickness or is lower than a tenth of the barrier thickness.

8. The structure according to claim 1, wherein the barrier thickness is between 100 and 300 nm.

9. A semi-conducting device, comprising a plurality of semi-conducting structures, as optical structures, wherein at least one of the structures is a structure according to claim 1.

10. The semi-conducting device according to claim 9, comprising an optical part and a processing part, the optical part including the plurality of optical structures which are configured to receive an electromagnetic radiation and to transform the electromagnetic radiation into an electrical signal, the processing part including semi-conducting structures arranged between them to process the electrical signals of the optical structures.

11. A method for manufacturing a semi-conducting structure according to claim 1, comprising:

providing a first zone of a first conductivity type and made of a first semi-conductor material, the first semi-conductor material being constituted of constituent elements, such that a different proportion of at least two of the constituent elements corresponds to a variation in the bandgap energy of the first semi-conductor material;

forming a first interface zone in contact with the first zone, the first interface zone having a first interface thickness and a composition of constituent elements which is varied on the entire interface thickness from a proportion corresponding to that of the first semi-conductor material to a barrier proportion;

forming a barrier zone in contact with the first interface zone such that the first interface zone interfaces the first zone and the barrier zone, the barrier zone having a barrier thickness at least lower than twice the first interface thickness, the barrier zone being constituted of the constituent elements and including on an entire barrier thickness a proportion such that the barrier zone has a bandgap energy higher than that of the first zone, a proportion of constituent elements for which the barrier zone has the lowest bandgap energy being equal to a barrier proportion;

forming a second interface zone on a second interface thickness, a composition of the constituent elements of the second interface zone being varied from the barrier proportion to a proportion corresponding to that of a second semi-conductor material, the second interface thickness being lower than half a barrier thickness;

forming a second zone of the same conductivity type as the first zone, the second zone being made of the second semi-conductor material consisting of the constituent elements, the second zone being arranged such that the barrier zone is provided between the first and second zones, a bandgap energy of the second zone being such that a difference in absolute value between an energy of an energy band extremum corresponding to the majority carrier for the bandgap energy minimum of the barrier zone and an energy of same extremum of the second zone is equal to at least 10 times the heat energy at the operating temperature rating.

* * * * *